(12) United States Patent
Debabrata et al.

(10) Patent No.: US 10,109,542 B2
(45) Date of Patent: Oct. 23, 2018

(54) SOLID-STATE STACKED DIE CONTACTORS

(71) Applicant: Hamilton Sundstrand Corporation, Charlotte, NC (US)

(72) Inventors: Pal Debabrata, Hoffman Estates, IL (US); John Horowy, Rockford, IL (US); Eric Karlen, Rockford, IL (US); Rainer J. Seidel, Tussenhausen (DE)

(73) Assignees: Hamilton Sundstrand Corporation, Charlotte, NC (US); HS Elektronik Systeme GmbH, Noerdlingen (DE)

( * ) Notice: Subject to any disclaimer, the term of this patent is extended or adjusted under 35 U.S.C. 154(b) by 1011 days.

(21) Appl. No.: 14/245,620

(22) Filed: Apr. 4, 2014

(65) Prior Publication Data

US 2015/0287657 A1    Oct. 8, 2015

(51) Int. Cl.
*H01L 23/049* (2006.01)
*H01L 23/492* (2006.01)
*H01L 25/07* (2006.01)
*H05K 7/14* (2006.01)

(52) U.S. Cl.
CPC .......... *H01L 23/049* (2013.01); *H01L 23/492* (2013.01); *H01L 25/074* (2013.01); *H05K 7/1412* (2013.01); *H05K 7/1432* (2013.01); *H01L 2924/0002* (2013.01)

(58) Field of Classification Search
None
See application file for complete search history.

(56) References Cited

U.S. PATENT DOCUMENTS

| 7,837,496 | B1 | 11/2010 | Pal | |
| 2013/0105961 | A1* | 5/2013 | Jones | H05K 7/1432 257/691 |
| 2014/0118956 | A1* | 5/2014 | Kim | H01L 23/049 361/728 |
| 2014/0198454 | A1* | 7/2014 | Yuan | H05K 7/209 361/720 |

FOREIGN PATENT DOCUMENTS

| EP | 2680289 A1 | 1/2014 |
| EP | 2712040 A1 | 3/2014 |

OTHER PUBLICATIONS

Search Report in European Patent Application No. 15162159 dated Sep. 22, 2015.

* cited by examiner

*Primary Examiner* — Ali Naraghi
(74) *Attorney, Agent, or Firm* — Locke Lord LLP; Scott D. Wofsy; Christopher J. Cillié

(57) ABSTRACT

A solid-state contactor includes a housing, a lead, a bus plate, and an end connector. The lead extends through the housing and into an interior of the housing. The bus plate is disposed within the housing interior and mounts a die which is electrically connected to the lead through the bus plate. The end connector extends between the bus plate and the lead, attaching to the bus plate at an angle for coupling a plurality of bus plates with die to the lead in a stacked arrangement.

16 Claims, 6 Drawing Sheets

SOLID-STATE STACKED DIE CONTACTORS

BACKGROUND OF THE INVENTION

1. Field of the Invention

The present disclosure relates to electrical power distribution systems, and more particularly to solid-state switching devices for power distribution systems.

2. Description of Related Art

Power distribution systems employ switching devices like contactors or logic-controlled relay devices for controlling current flow between power sources and powered devices. The switching devices typically couple between opposing bus bars that electrically connect between a power source and a powered device. Contactors typically employ a structure that physically moves between open and closed positions to electrically connect the opposing bus bars. Logic controlled relay devices or transistors typically employ fixed semiconductor structures for electrically connecting opposing bus bars. Switching logic applied to the relay device or transistor operates to change the resistivity of the semiconductor structure and selectively allows current to flow through the structure.

Because contactors employ physical structures that move between open and closed positions, wear and arcing can be of concern in some contactors. In contrast, logic controlled relays and transistors electrically connect and disconnect opposing bus bars without relying on physical movement, and are therefore less susceptible to wear and arcing. However, logic controlled relays and transistors generate heat that must be managed in order to ensure reliable operation of the switching device, potentially limiting the applicability of such devices. Moreover, in certain types of power distribution systems, such as aircraft power distribution systems, the thermal management challenge of logic-controlled relays is addressed through use of relatively large planar bus bars.

Such conventional switching devices have generally been considered satisfactory for their intended purpose. However, there is still a need in the art for improved switching devices. The present disclosure provides a solution for this need.

SUMMARY OF THE INVENTION

A solid-state contactor includes a housing, a lead, a bus plate, and an end connector. The lead extends through the housing and into an interior of the housing. The bus plate is disposed within the interior of the housing and mounts a die which connects electrically to the lead through the bus plate. The end connector extends between the bus plate and the lead, attaching to the bus plate at an angle for coupling a plurality of bus plates with die to the lead in a stacked arrangement.

In certain embodiments, the bus plate can be a first bus plate and the contactor can include a second bus plate. The end connector can attach to the first and second bus plates at an angle. The angle can be about 90-degrees such that the end connector is aligned orthogonal with respect to the first and second bus plates. The end connector can be integral with the first and second bus plates. It is contemplated that a plurality of layers bonded to one another can form the end connector. A first layer can be disposed over a surface of the first bus plate and facing the second bus plate. A second layer can be disposed over a surface of the second bus plate and facing the first bus plate. The first and second layers can being joined or bonded to one another and the respective bus plate surfaces by ultrasonic welds.

In accordance with certain embodiments, the bus plate can be a split bus plate with first and second bus plate portions. A gap defined between the first and second bus plate portions can electrically isolate the first bus plate portion from the second bus plate portion. The die can mount to the first bus plate portion and an interconnect can electrically connect the die to the second bus plate portion. It is contemplated that the interconnect can be conformal to a portion of the die. The interconnect can be conformal to a portion of the second bus plate portion for electrically connecting the first bus plate to a second bus plate portion. The interconnect can be a direct-write interconnect. It is also contemplated that an insulating material can be disposed in the gap. The insulating material can provide a substrate for the interconnect. The insulating material can also be conformal with bus plate portion mounting the die. The insulator can be a direct-write insulator.

It is also contemplated that in certain embodiments the housing can have a shape conforming to a shape of a mechanical contactor. The housing can envelope the first and second bus plates, the end connector, and a portion of the lead as a monolithic structure. The leads can extend through a wall of the housing and extend into the environment external to the housing for conducting heat from the housing interior to the external. The lead can have a shape conforming to a shape of a least of the mechanical contactor assembly such that heat from the solid-state contactor is conducted from the housing interior to the external environment at a rate substantially the same as heat is conducted from a mechanical contactor assembly. The lead can connect to a bus bar of an electrical assembly configured for receiving the mechanical contactor lead. At least one second die can be mounted to the second bus plate portion for balancing heat transfer from the dies through a first lead thermally communicative with the first bus plate portion (mounting the first die) and a second lead thermally communicative with the second bus plate portion (mounting the second die).

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
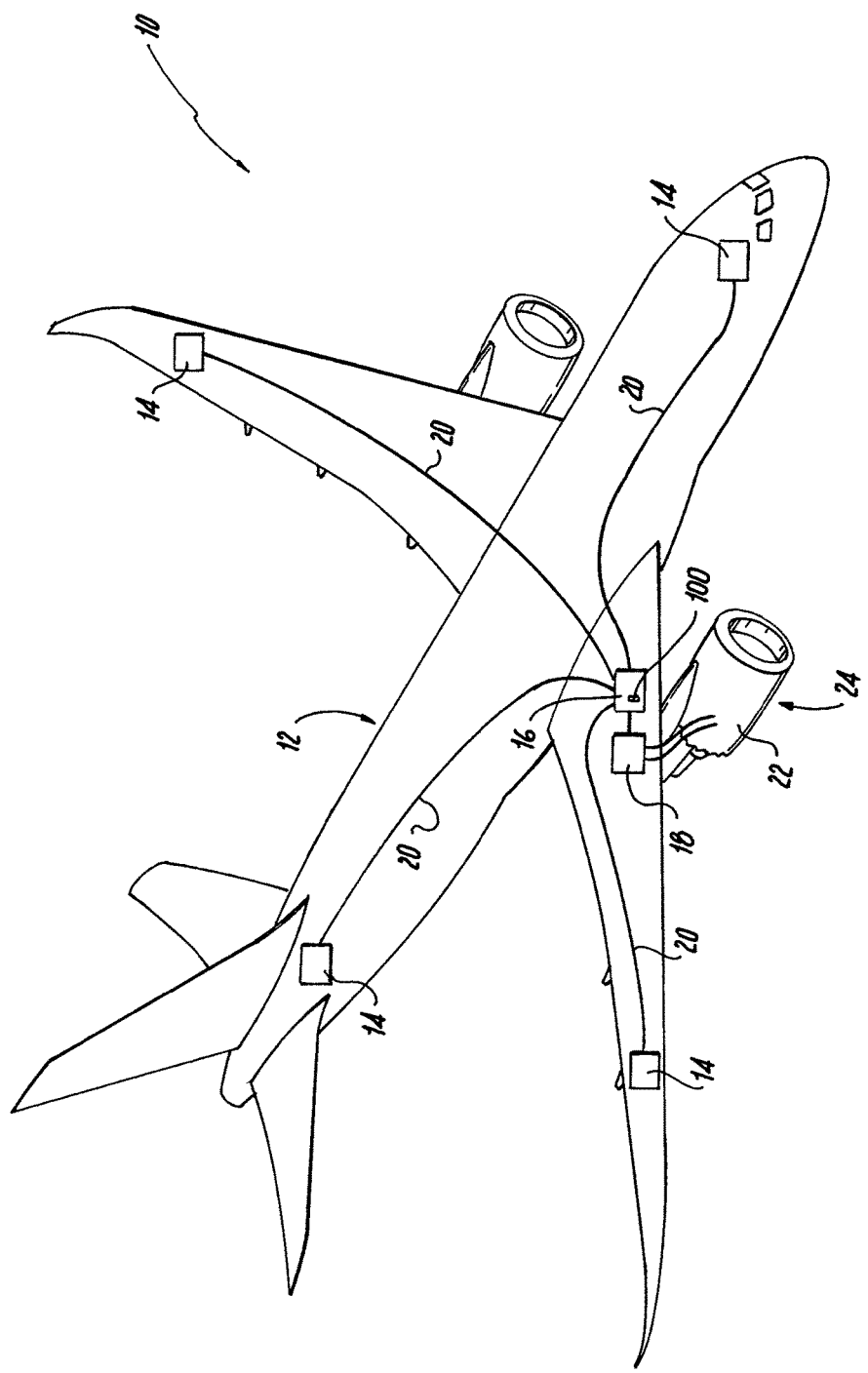
FIG. 1 is a perspective view of an exemplary embodiment of an aircraft with a power distribution assembly including a solid-state contactor constructed in accordance with the present disclosure, showing the power distribution assembly and solid-state contactor schematically.

Reference will now be made to the drawings wherein like reference numerals identify similar structural features or aspects of the subject disclosure. For purposes of explanation and illustration, and not limitation, a partial view of an exemplary embodiment of the stacked die solid-state contactor in accordance with the disclosure is shown in FIG. 1 and is designated generally by reference character 100. Other embodiments of stacked die solid-state contactors in accordance with the disclosure, or aspects thereof, are provided in FIGS. 2-5, as will be described. The systems and methods described herein can be used for electrical power distribution systems, such as in aircraft power distribution assemblies for example.

With reference to FIG. 1, an aircraft 10 including an electrical power distribution system 12 is shown. Electrical power distribution system 12 includes a plurality of power consuming devices 14, at least one power distribution assembly 16, an electrical power source 18, and electrical conduits 20. Power consuming devices 14 include devices such as environmental control units, cockpit control devices, lighting systems, de-icing systems, and the likes that respectively require single-phase or multi-phase current. Power distribution assembly 16 connects electrically to at least one of the power consuming devices 14 and is configured for selectively supplying electrical current of suitable phase and voltage to power consuming device 14 using solid-state contactor 100. Electrical power source 18 includes a power generation system 22 that utilizes rotation within an aircraft main engine 24 to generate either single-phase or multi-phase electrical power. As will be appreciated by those skilled in the art, other sources of electrical power are possible within the scope of the present disclosure including batteries, auxiliary power units, or external power sources for example. As will also be appreciated, solid-state contactor 100 allows for application of electrical power to electrically connected power consuming device 14 independently from other power consuming devices.

Figure 2:
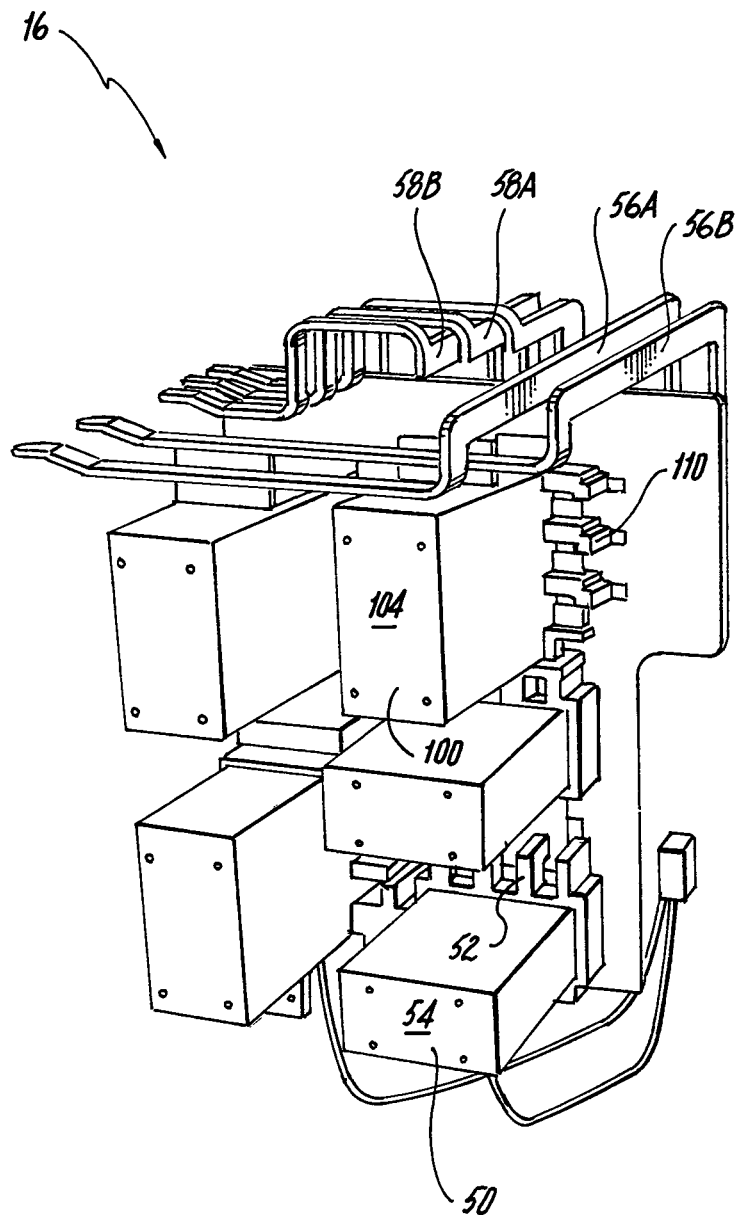
FIG. 2 is a perspective view of the power distribution assembly of FIG. 1, showing housings of the solid-state contactor and a mechanical contactor assembly, respectively.

With reference to FIG. 2, power distribution assembly 16 is shown. Power distribution assembly 16 includes a mechanical contactor assembly 50, solid-state contactor 100, a first and a second source terminal 56A and 56B, and a first and a second return terminal 58A and 58B. First and second source terminals 56A and 56B each connect to power source 18 (shown in FIG. 1) and are configured to receive a supply of power therefrom. First and second return terminals 58A and 58B connect to separate power consuming devices 14 (shown in FIG. 1) and are configured to provide flows of power thereto through mechanical contactor assembly 50 and solid-state contactor assembly 100, respectively.

Mechanical contactor assembly 50 has a housing 54, an input lead 52 and an output lead (not shown for clarity purposes). Input lead 52 is electrically connected to first source terminal 56A and the output lead is electrically connected to first return terminal 58A. A movable member (not shown) is disposed within housing 54 and is configured to move between an open and closed position. In the open position no current flows through mechanical contactor assembly 50. In the closed position, current flows from first source terminal 56A, through the movable member, and into power consuming device 14 through first return terminal 58A. As will be appreciated by those skilled in the art, heat generated by resistive heating of components within mechanical contactor assembly 50 flows through input lead 52 and/or the output lead and into source and return terminals 56A and 58B for dissipation by natural convection and radiation into the ambient atmosphere.

Figure 3:
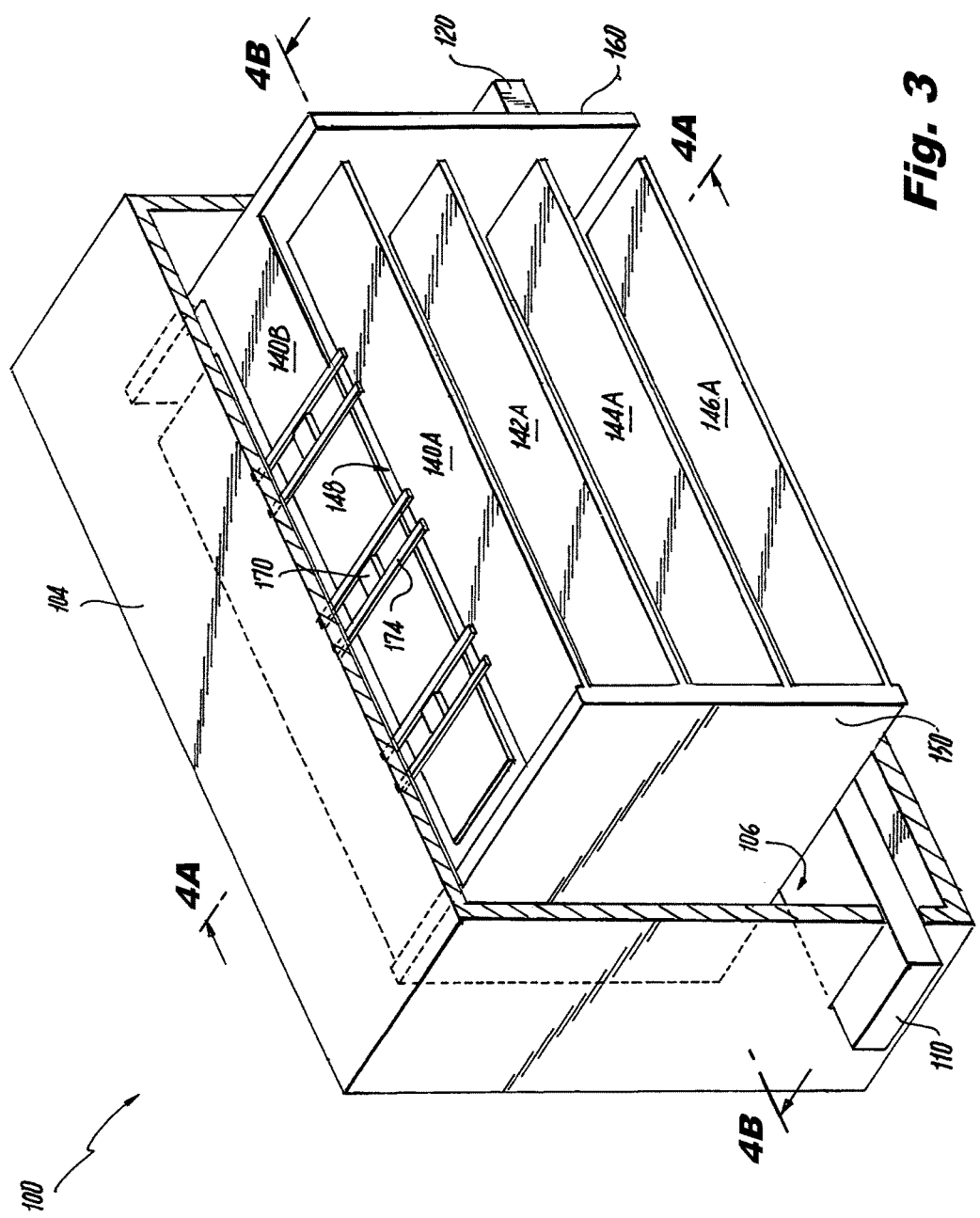
FIG. 3 is a schematic perspective view of the solid-state contactor of FIG. 1, showing dies mounted on a portion of a split bus plate disposed within the contactor housing.

Solid-state contactor 100 has a housing 104, a first lead 110, and a second lead 120 (shown in FIG. 3). First lead 110 is electrically connected to second source terminal 56B and second lead 120 is electrically connected to second return terminal 58B. Solid-state contactor 100 includes at least one MOSFET device packaged within a die 170 (shown in FIG. 4) configured and arranged such that upon on application of a control voltage electrical current to flow between second source terminal 56B and second return terminal 58B. Solid-state contactor 100 includes a housing 104 that conforms to the shape of housing 54 of mechanical contactor 50. First and second leads 110 and 120 of solid-state contactor 100 are structurally similar to input lead 52 and the output lead (not shown for clarity reasons) of mechanical contactor assembly 50. In embodiments, first and second leads 110 and 120 are further configured to transfer heat from the interior of solid-state contactor 100 at a similar rate as that which flows from mechanical contactor assembly 50 through input lead 52 and the output lead (not shown for clarity reasons) during operation. This allows for mechanical interchangeability of solid-state contactor 100 with conventional mechanical contactor assemblies. While described herein in the context of a single-phase application, it is to be understood that embodiments of solid-state contactors described herein are also suitable for multi-phase applications.

With reference to FIG. 3, solid-state contactor 100 is shown in a cutaway view. Solid-state contactor 100 includes housing 104, first lead 110, and second lead 120. Solid-state contactor 100 also includes a plurality of split bus plates having first and second bus plate portions (e.g., a first bus plate 140 formed from an outer and an inner bus plate portion 140A and 140B, a second bus plate 142 formed from an outer and an inner bus plate portion 142A and 142B, a third bus plate 144 formed from an outer and an inner bus plate portion 144A and 144B, and a fourth bus plate 140 formed from an outer and an inner bus plate portions 146A and 146B), a first end connector 150, and a second end connector 160. First bus plate 140, second bus plate 142, third bus plate 144, and fourth bus plate 146 are arranged within interior 106 of housing 104 in a stacked arrangement such that dies 170 disposed thereon are in a stacked arrangement (shown in FIG. 4A and FIG. 4B). This allows for packaging solid-state contactor 100 within a package footprint similar to that of mechanical contactor assembly 50. In embodiments, first and second leads 150 and 160 are constructed so as to have a thickness of about 0.5 centimeters (about 0.2 inches). In certain embodiments, first, second, third, and fourth bus plates 140, 142, 144, and 146 are thin bus bars constructed from laminated ano-fol or thin Al 1050.

First lead 110 extends through housing 104 and connects to first end connector 150. First end connector 150 in turn connects to first bus plate outer portion 140A, second bus plate outer portion 142A, third bus plate outer portion 144A, and fourth bus plate outer portion 146A. Second lead 120 extends through housing 104 and connects to second end connector 160. Second end connector 160 in turn connects to first bus plate inner portion 140B, second bus plate inner portion 142B, third bus plate inner portion 144B, and fourth bus plate inner portion 146B.

Figure 4A:
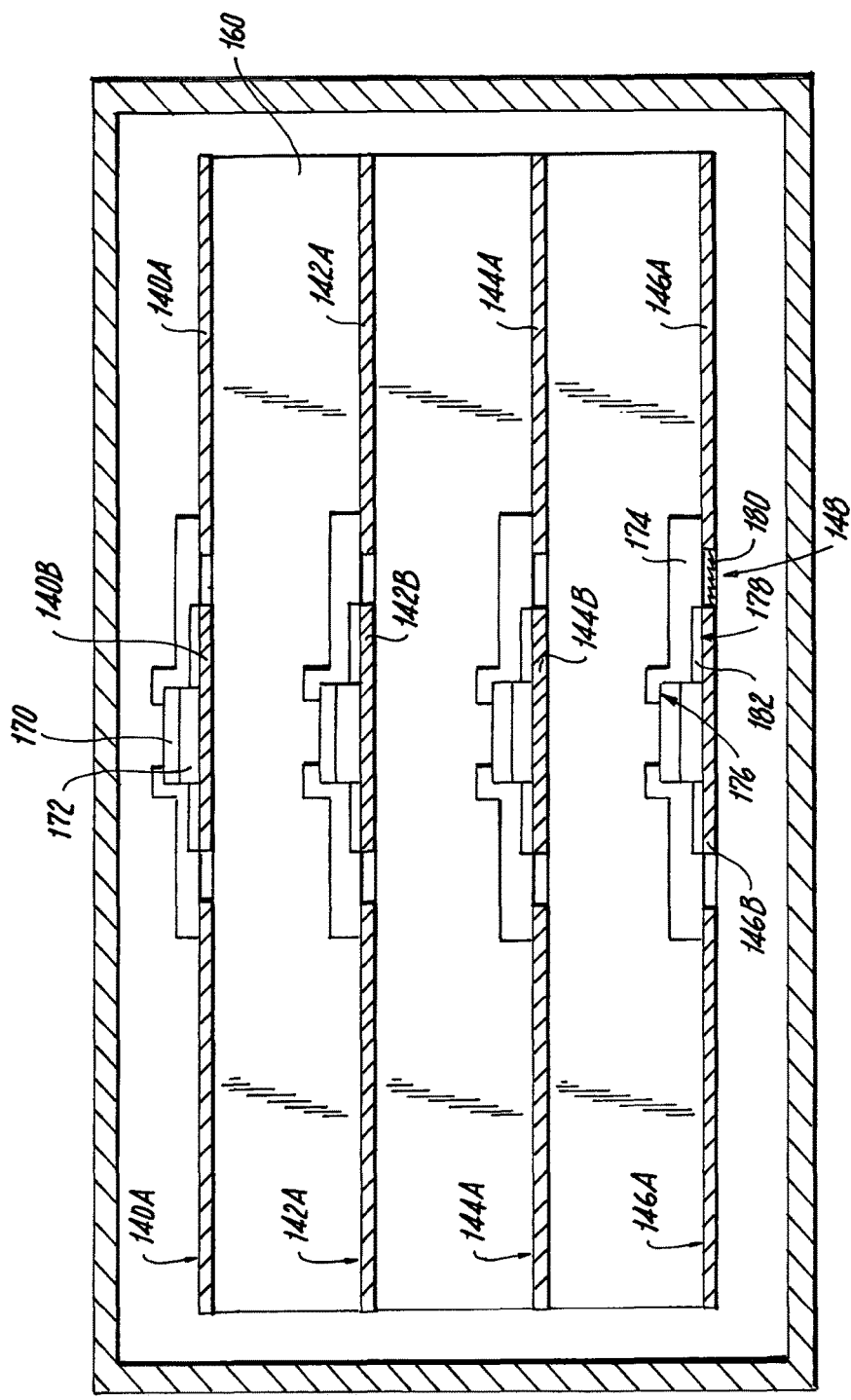
FIG. 4A is a lateral cross-sectional view of the solid-state contactor of FIG. 3, showing the dies and die interconnects extending across gaps defined between portions of the split bus plates.
Figure 4B:
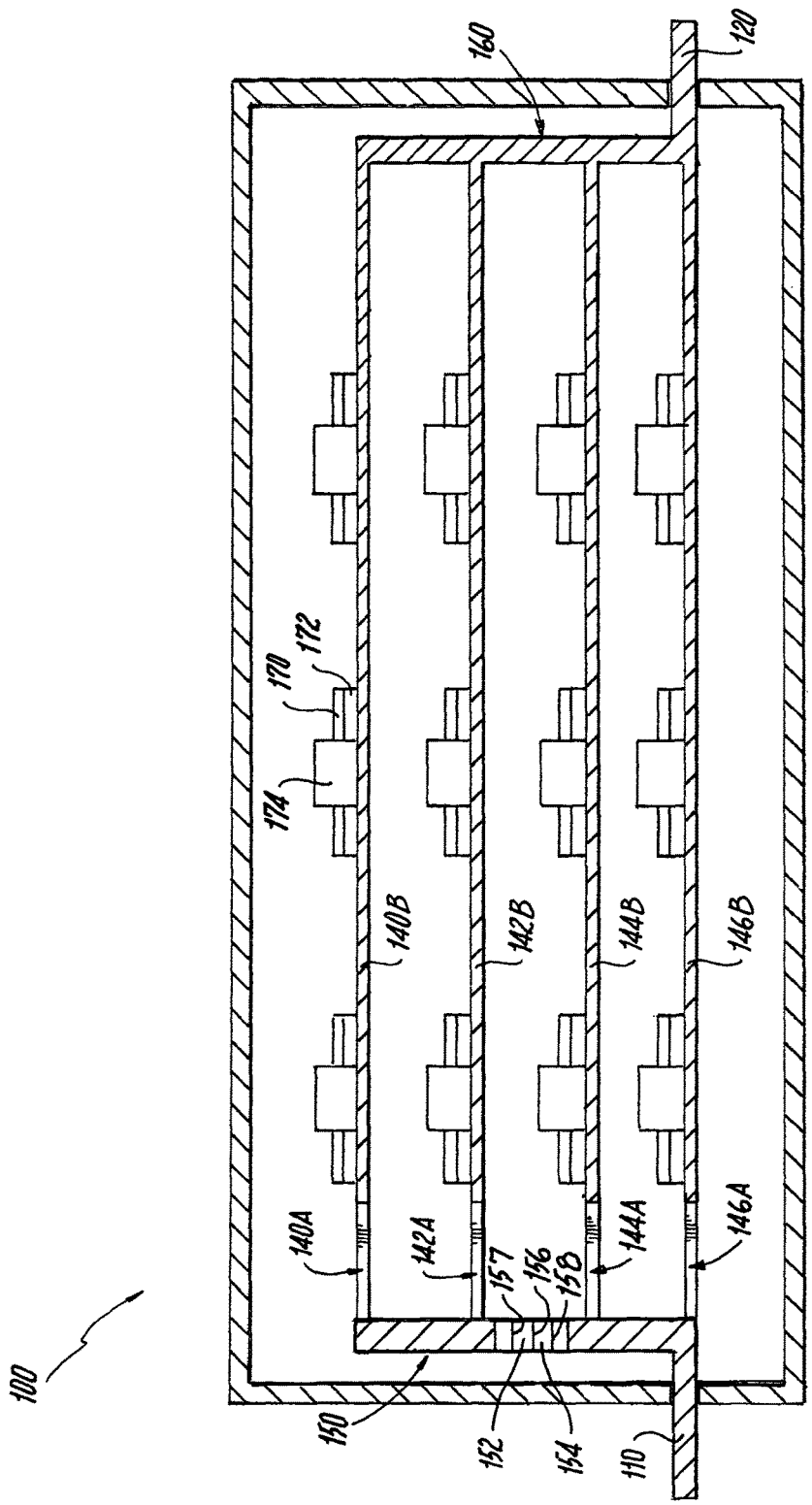
FIG. 4B is a longitudinal cross-sectional side view of the solid-state contactor of FIG. 3, showing construction of an end connectors of the solid-state contactor.

With reference to FIG. 4A, solid-state contactor 100 is shown in lateral cross-section. First bus plate inner portion 140B, second bus plate inner portion 142B, third bus plate inner portion 144B, and fourth bus plate inner portion 146B each mount at least one die 170. As illustrated in FIG. 3 and FIG. 4B, first bus plate inner portion 140B mounts three dies 170. With continuing reference to FIG. 4A, dies 170 mount to bus plate inner portions 140B, 142B, 144B, and 146B. This allows for conducting a predetermined amount of heat out of housing interior 106 through first bus plate inner portion 140B, second end connector 160, and second lead 120. This predetermined amount of heat is greater than an amount of heat conducted out of housing interior 106 through outer bus plate portion 140B, first end connector 150, and first lead 110 owing to the mounting of dies 170.

In certain embodiments, it is contemplated that dies 170 are arranged both inner and outer bus plate portions 140A and 140B. This allows for balancing heat transfer out of interior 106 through conduction using both first and second leads 150 and 160. As will be appreciated by those skilled in the art in view of the present disclosure, dies 170 can be distributed across inner and outer bus plate portions of bus plates to mimic heat transfer from conventional mechanical contactor assembly 50 (shown in FIG. 2). This enables solid-state contactor 100 to conduct heat through first and second leads 110 and 120 as substantially the same rate as conventional mechanical contactor assembly 50 conducts heat through its respective source and return terminals when energized, improving the interchangeability of mechanical contactor assembly 50 with solid-state contactor 100. It also can potentially improve the reliability of power distribution assembly 16 by replacing conventional mechanical contactor assemblies potentially subject to wear and/or arcing with solid-state contactors that are less susceptible to such problems having similar heat transfer requirements.

With continuing reference to FIG. 4A, dies 170 mount to respective first, second, third, and fourth bus plates 140, 142, 144, and 146 with an adhesive material 172. Adhesive material 172 (identified only with respect to the 170 mounted on inner bus plate portion 140B) is electrically conductive and provides a path for current flow between first bus plate inner portion 140B and outer bus plate portion 140A. Interconnects 174 electrically connect dies 170, e.g. one or more MOSFETs disposed within die 170, with the bus plate portion opposing the bus plate portion to which die 170 mounts, interconnect 174 extending between die 170 and first bus plate outer portion 140A in FIG. 4A. With reference to die 170 mounted to fourth bus bar inner portion 146B, interconnect 174 is conformal with a portion 176 of die 170. Interconnects 174 is also conformal with a portion 178 of fourth bus plate inner portion 146.

In embodiments, interconnect 174 is a direct-write interconnect formed over an insulating material 180 occupying a portion of gap 148 and an insulating material 182 adjacent to die 170 and fourth bus plate inner portion 146B, electrically isolating interconnect 174 from fourth bus plate inner portion 146B to which die 170 mounts. Conventional interconnects are typically wire bonds extending between source and returns. While generally suitable for their intended purposes, wire bonds can form loops or arcuate segments due to variability of the manufacturing process. This can cause parasitic capacitance, which reduces the efficiency of the device due to opposition to current flow. Direct-write interconnect 174, in contrast, has a substantially linear path (e.g. is linear instead of an arcuate path typically formed by a wire bond) that forms a direct path between the coupled current source and return, i.e. between die 170 and fourth bus plate outer portion 146A. It can therefore generates less parasitic capacitance that a conventional wire bond, potentially allowing for more efficient current flow between the coupled components.

With reference to FIG. 4B, solid-state contactor 100 is shown in longitudinal cross-section. First end connector 150 spans first bus plate outer portion 140A, second bus plate outer portion 142A, third bus plate outer portion 144A, and fourth bus plate outer portion 146A, structurally attaching to the bus plate outer portion. This provides electrical connectivity and thermal communication between the bus plate outer portions and the external environment through first end connector 150 and first lead 110. Second end connector 160 spans first bus plate inner portion 140A, second bus plate inner portion 142B, third bus plate inner portion 144B, and fourth bus plate inner portion 146B, structurally attaching to the bus plate inner portions. This similarly provides electrical connectivity and thermal conduction between inner portions of the bus plates and the external environment through second end connector 160 and second lead 120. As illustrated, first and second end connectors 150 and 160 attach to inner and outer portions of the bus plates at about a 90-degree angle. As will be appreciated, outer attachment angles are possible within the scope of the present disclosure for purpose of providing suitable housing shape and packaging for an intended application.

First and second end connectors 150 and 160 are integral with respective attached inner or outer portions of first, second, third and fourth bus plates 140, 142, 144, and 146. In certain embodiments, first and second end connectors 150 and 160 include a plurality of foil layers joined (bonded) to form the end connector. For example, first end connector 150 is illustrated in FIG. 4B with a plurality of layers including a first layer 154 and a second layer 152. First layer 154 is disposed over an upper surface of third bus plate outer portion 144A and joins thereto by an ultrasonic weld 158. Second layer 152 is disposed under a lower surface of second bus plate outer portion 142A and is joins thereto by an ultrasonic weld 157. Second layer 152 is further disposed over first layer 154 and joins thereto by an ultrasonic weld 156. In this respect, first end connector 150 and bus plate outer portions 140A, 142A, 144A, and 146A form an integral structure including first and second layers 152 and 154 joined (bonded) by ultrasonic welds. It is contemplated that one or both of first and second end connectors 150 and 160 are fabricated by successively ultrasonically welding layers formed from foil of conductive material to one another and respective adjacent bus plates, thereby defining spacing between adjacent bus plates. Examples of processes suitable for constructing structures such as the end connectors described herein include foil-based ultrasonic additive manufacturing processes capable of joining dissimilar materials, such as those available from Fabrisonic LLC of Ann Arbor, Mich.

Figure 5:
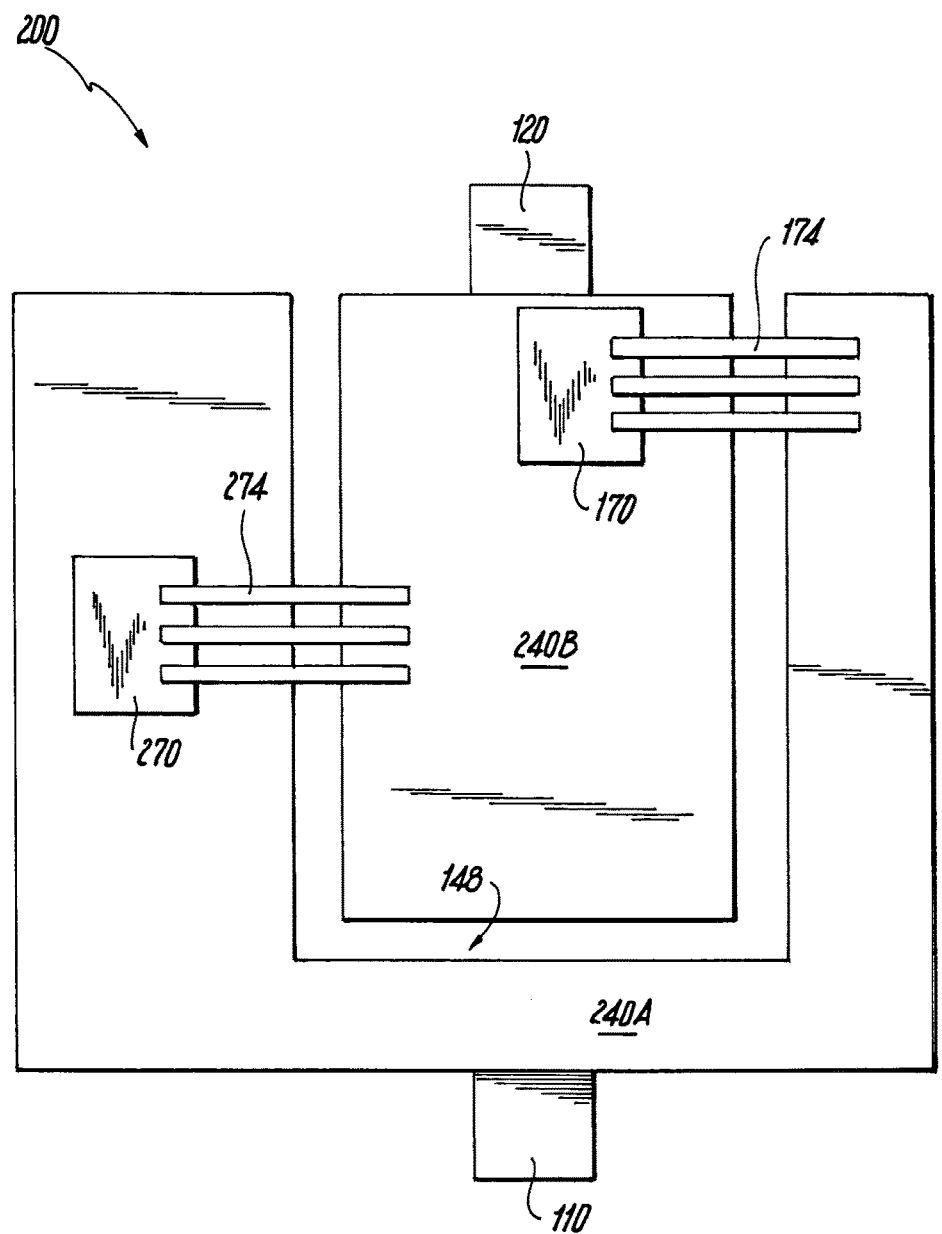
FIG. 5 is a schematic plan view of another embodiment of a solid-state contactor, showing a die on each portion of a split bus plate, according to an embodiment.

With reference to FIG. 5, second embodiment of a solid-state contactor 200 is shown. Solid-state contactor 200 is similar to solid-state contactor 100, and additionally includes a second die 270 with a second interconnect 274. Second die 270 is mounted to a portion of split bus plate 240, i.e. return bus plate portion 240A opposite the portion mounting first die 170, i.e. source bus plate portion 240B. Since both first and second die 170 and 270 generate heat, mounting first and second dies 170 and 270 on different split bus plate portion allows for balancing heat transfer by conduction into bus bars mounting solid-state contactor 200, thereby conducting heat from solid-state contactor 200 in a way that mimics heat conduction from mechanical contactor assembly 50.

The methods and systems of the present disclosure, as described above and shown in the drawings, provide for solid-state contactors with superior properties including interchangeability with conventional mechanical contactor assemblies in existing power distribution assemblies using existing bus bars as heat sinks. While the apparatus and methods of the subject disclosure have been shown and described with reference to preferred embodiments, those skilled in the art will readily appreciate that changes and/or modifications may be made thereto without departing from the spirit and scope of the subject disclosure.

What is claimed is:

1. A solid-state contactor, comprising: a housing; a lead extending through the housing and into an interior of the housing; a bus plate disposed in the housing interior and mounting a die, wherein the die is electrically connected to the lead through the bus plate; and an end connector extending between the bus plate and the lead, wherein the end connector attaches to the bus plate at an angle for coupling a plurality of bus plates with die to the lead in a stacked arrangement, wherein the bus plate is a first bus plate and further including a second bus plate, wherein the end connector attaches to the second bus plate at an angle, wherein the end connector includes a first layer and a second layer, the first layer being disposed over a surface of the first bus plate facing the second bus plate, the second layer being disposed over a surface of the second bus plate facing the first bus plate.

2. A contactor as recited in claim 1, wherein the end connector attaches to the first bus plate and the second bus plate at about the same angle.

3. A contactor as recited in claim 1, further including a direct write interconnect electrically connecting the die to the end connector.

4. A contactor as recited in claim 3, wherein the interconnect is conformal with a portion of the die and the bus plate.

5. A contactor as recited in claim 4, further including an insulator conformal with the portion of the bus plate arranged between the bus plate and the interconnect.

6. A contactor as recited in claim 1, wherein the housing envelopes the end connector and bus plate, wherein the lead extends through the housing for passively dissipating heat from the housing interior to the environment external to the housing.

7. A contactor as recited in claim 6, wherein the housing has a shape conforming to a shape of a mechanical contactor assembly.

8. A contactor as recited in claim 1, wherein the bus plate is a split bus plate having first and second split bus plate portions, wherein the first and second split bus portions are separated by an electrically insulating gap.

9. A power distribution assembly, comprising:
a solid-state contactor as recited in claim 1,
wherein the end connector includes a first and a second layer,
wherein the first layer is disposed over a surface of the first bus plate facing the second bus plate,
wherein the second layer is disposed over a surface of the second bus plate facing the first bus plate, and
wherein the first and second layers are joined to the other and bus plates by at least one ultrasonic weld; and
a bus bar connected to the solid-state contactor lead.

10. A power distribution assembly, comprising:
a solid-state contactor as recited in claim 1, wherein the end connector is a first end connector and further including a second end connector,
wherein the a direct write interconnect electrically connects the die to the to the second end connector; and
a bus bar connected to the solid-state contactor lead.

11. A power distribution assembly, comprising:
a bus bar configured for receiving a mechanical contactor lead; and a solid-state contactor, including: a housing; a lead connected to the bus bar and extending through the housing and into an interior of the housing; a bus plate disposed within an interior of the housing interior and mounting a die, wherein the die is electrically connected to the lead through the bus plate; and an end connector extending between the bus plate and the lead, wherein the end connector attaches to the bus plate at an angle for coupling a plurality of bus plates with die to the lead in a stacked arrangement, wherein the end connector includes a first and a second layer, the first layer being disposed over a surface of the first bus plate facing the second bus plate, the second layer being disposed over a surface of the second bus plate facing the first bus plate.

12. A power distribution assembly as recited in claim 11, wherein the housing has a shape conforming to a shape of a mechanical contactor assembly.

13. A power distribution assembly as recited in claim 11, wherein the end connector is a first end connector and further including a second end connector, wherein the a direct write interconnect electrically connects the die to the to the second end connector.

14. A contactor as recited in claim 13, wherein the interconnect is conformal with a portion of the die and the bus plate.

15. A solid-state contactor, comprising:
a housing;
first and second leads extending through the housing and into the housing interior;
a split bus plate disposed within the housing interior and having a first split bus plate portion separated from a second split bus plate portion by an electrically insulting gap;
a first end connector extending between the first lead and the first split bus plate portion, the first end connector attaching to the first split bus plate portion at an angle for coupling a plurality of bus plates with die to the lead in a stacked arrangement;
a second end connector extending between the second lead and the second split bus plate portion, the first end connector attaching to the second split bus plate portion at an angle for coupling a plurality of bus plates with die to the lead in a stacked arrangement;
a die mounted to the first split bus bar portion and electrically connected therethrough to first lead; and
an interconnect extending across the electrically insulting gap and electrically connecting the die to the second lead through the second split bus bar portion.

16. A solid-state contractor comprising: a housing;
a lead extending through the housing and into an interior of the housing; a bus plate disposed in the housing interior and mounting a die, wherein the die is electrically connected to the lead through the bus plate; an end connector extending between the bus plate and the lead, wherein the end connector attaches to the bus plate at an angle for coupling a plurality of bus plates with die to the lead in a stacked arrangement wherein the bus plate includes a continuous electrically conductive bus bar supporting the die, attached to the end connector and electrically connecting the die in series with the end connector without an intervening interconnect, wherein the end connector includes a first layer and a second layer, the first layer being disposed over a surface of the first bus plate facing the second bus plate, the second layer being disposed over a surface of the second bus plate facing the first bus plate.

* * * * *